United States Patent
Xie et al.

(10) Patent No.: US 11,500,505 B2
(45) Date of Patent: Nov. 15, 2022

(54) TOUCH SUBSTRATE AND TOUCH DISPLAY DEVICE

(71) Applicants: Hefei Xinsheng Optoelectronics Technology Co., Ltd., Hefei (CN); BOE Technology Group Co., Ltd., Beijing (CN)

(72) Inventors: Xiaodong Xie, Beijing (CN); Min He, Beijing (CN); Jing Wang, Beijing (CN); Bin Pang, Beijing (CN); Xinxiu Zhang, Beijing (CN); Xue Zhao, Beijing (CN)

(73) Assignees: HEFEI XINSHENG OPTOELECTRONICS TECHNOLOGY CO., LTD., Anhui (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 144 days.

(21) Appl. No.: 17/254,649

(22) PCT Filed: Mar. 24, 2020

(86) PCT No.: PCT/CN2020/080986
§ 371 (c)(1),
(2) Date: Dec. 21, 2020

(87) PCT Pub. No.: WO2021/189274
PCT Pub. Date: Sep. 30, 2021

(65) Prior Publication Data
US 2022/0050557 A1    Feb. 17, 2022

(51) Int. Cl.
G06F 3/044    (2006.01)
G06F 3/041    (2006.01)
H01L 27/32    (2006.01)

(52) U.S. Cl.
CPC .......... G06F 3/0448 (2019.05); G06F 3/0445 (2019.05); G06F 3/0446 (2019.05); G06F 3/04164 (2019.05); H01L 27/323 (2013.01)

(58) Field of Classification Search
None
See application file for complete search history.

(56) References Cited

U.S. PATENT DOCUMENTS

| 2015/0220179 A1* | 8/2015 | Kimura | G06F 3/0443 345/174 |
| 2018/0188839 A1* | 7/2018 | Wang | G06F 3/044 |
| 2021/0405821 A1* | 12/2021 | Li | G06F 3/0445 |

* cited by examiner

*Primary Examiner* — Amare Mengistu
*Assistant Examiner* — Sarvesh J Nadkarni
(74) *Attorney, Agent, or Firm* — IPro, PLLC

(57) ABSTRACT

Embodiments of the present disclosure provide a touch substrate and a touch display device. In the touch substrate, the first touch control electrodes are provided with the shadow elimination structures at the first intersections, and the orthographic projections of the shadow elimination structures on the base substrate cover the orthographic projections of the connection through holes on the base substrate, so that shadows of the connection through holes can be shielded by the shadow elimination structures, when the user watches the touch substrate from the side, away from the signal line layer, of the base substrate, and thus the ghosting shadow problem of the connection through holes can be resolved.

20 Claims, 13 Drawing Sheets

TOUCH SUBSTRATE AND TOUCH DISPLAY DEVICE

CROSS REFERENCE TO RELATED DOCUMENTS

The present application is a national phase entry under 35 U.S.C. § 371 of International Application No. PCT/CN2020/080986, filed on Mar. 24, 2020.

FIELD

The present disclosure relates to the technical field of touch control, and in particular to a touch substrate and a touch display device.

BACKGROUND

As a kind of intelligent human-computer interaction interface products, touch display devices have been used more and more widely in social production and life, and especially develop rapidly in the field of electronic products (such as smart phones and tablet computers). There are a wide variety of touch display device technologies, mainly including resistance type, capacitance type, infrared type, surface acoustic wave type and the like. Based on the characteristics of sensitive response, multi-point touch control, long service life and the like, the capacitive touch display device has been widely applied to social production and life.

SUMMARY

A touch substrate provided by embodiments of the present disclosure includes:
a base substrate;
a first touch control electrode layer on a side of the base substrate; wherein the first touch control electrode layer comprises a plurality of grid-shaped first touch control electrodes arranged at intervals, and the first touch control electrodes extend in a first direction;
a first insulating layer on a side, facing away from the base substrate, of the first touch control electrode layer;
a second touch control electrode layer on a side, facing away from the base substrate, of the first insulating layer; wherein the second touch control electrode layer comprises a plurality of grid-shaped second touch control electrodes arranged at intervals, and the second touch control electrodes extend in a second direction;
a second insulating layer on a side, facing away from the base substrate, of the second touch control electrode layer; wherein the second insulating layer is provided with a plurality of connection through holes; and
a signal line layer on a side, facing away from the base substrate, of the second insulating layer; wherein the signal line layer comprises a plurality of second signal transmission lines;
wherein:
each of the plurality of second touch control electrodes is electrically connected to at least one of the plurality of second signal transmission lines through at least one of the plurality of connection through holes;
orthographic projections of the first touch control electrodes on the base substrate and orthographic projections of the second touch control electrodes on the base substrate have a plurality of first intersections, wherein the connection through holes each is arranged corresponding to positions of the respective first intersections, and orthographic projections of the connection through holes on the base substrate and orthographic projections of the first intersections on the base substrate have overlapping regions; and
the first touch control electrodes at the first intersections have shadow elimination structures; and orthographic projections of the shadow elimination structures on the base substrate cover the orthographic projections of the connection through holes on the base substrate.

Optionally, in some embodiments of the present disclosure, the shadow elimination structures include first planar structures. The first planar structures and the first touch control electrodes are arranged on a same layer, and wire widths of the first touch control electrodes in regions, where the first planar structures are located, are larger than those of the first touch control electrodes in other regions.

Orthographic projections of the first planar structures on the base substrate cover the orthographic projections of the connection through holes on the base substrate.

Optionally, in some embodiments of the present disclosure, the shadow elimination structures further includes strip-shaped first conductive parts. The first conductive parts and the first planar structures are arranged on the same layer.

In a same shadow elimination structure, an orthographic projection of a first conductive part on the base substrate and an orthographic projection of a first planar structure on the base substrate intersect.

Optionally, in some embodiments of the present disclosure, the orthographic projections of the second touch control electrodes on the base substrate cover orthographic projections of the first conductive parts on the base substrate.

Optionally, in some embodiments of the present disclosure, in a same first touch control electrode, an orthographic projection of a first conductive part on the base substrate is not in contact with orthographic projections of other grids, except a grid of the first touch control electrode in contact with the first conductive part, on the base substrate.

Optionally, in some embodiments of the present disclosure, the orthographic projections of the first touch control electrodes on the base substrate and the orthographic projections of the second touch control electrodes on the base substrate have a plurality of second intersections. Orthographic projections of the second intersections on the base substrate are not overlapped with the orthographic projections of the connection through holes on the base substrate.

The touch substrate further includes a plurality of second planar structures arranged on the same layer with the first touch control electrodes. Orthographic projections of the second intersections on the base substrate and orthographic projections of the second planar structures on the base substrate have overlapping regions.

Optionally, in some embodiments of the present disclosure, orthographic projections of the first planar structures on the base substrate and the orthographic projections of the second planar structures on the base substrate are substantially the same in shape and size.

Optionally, in some embodiments of the present disclosure, the touch substrate further includes a plurality of strip-shaped second conductive parts arranged on the same layer with the first touch control electrodes. The orthographic projections of the second intersections on the base substrate are partially overlapped with the orthographic projections of the second planar structures on the base substrate.

Optionally, in some embodiments of the present disclosure, the orthographic projections of the second touch control electrodes on the base substrate cover orthographic projections of the second conductive parts on the base substrate.

Optionally, in some embodiments of the present disclosure, the orthographic projections of the second conductive parts on the base substrate are not overlapped with orthographic projections of the first conductive parts on the base substrate.

Optionally, in some embodiments of the present disclosure, in the same first touch control electrode, the first conductive parts are directly electrically connected to the second conductive parts.

In the same first touch control electrode, orthographic projections of all the first conductive parts and the second conductive parts on the base substrate are in the orthographic projections of the second touch control electrodes on the base substrate.

A touch display device provided by embodiments of the present disclosure includes the above-mentioned touch substrate.

Optionally, in some embodiments of the present disclosure, the touch display device further includes a display panel.

The touch substrate is on a light emitting side of the display panel, and the base substrate is on a side, facing away from the display panel, of the signal line layer.

Optionally, in some embodiments of the present disclosure, the display panel includes at least one of a liquid crystal display panel or an electroluminescent display panel.

Optionally, in some embodiments of the present disclosure, the touch display device further includes an electroluminescent display panel that includes a packaging layer.

The touch substrate is on a light emitting side of the electroluminescent display panel. The base substrate is the packaging layer, and the signal line layer is on a side, facing away from the electroluminescent display panel, of the base substrate.

DETAILED DESCRIPTION OF THE EMBODIMENTS

Figure 1:
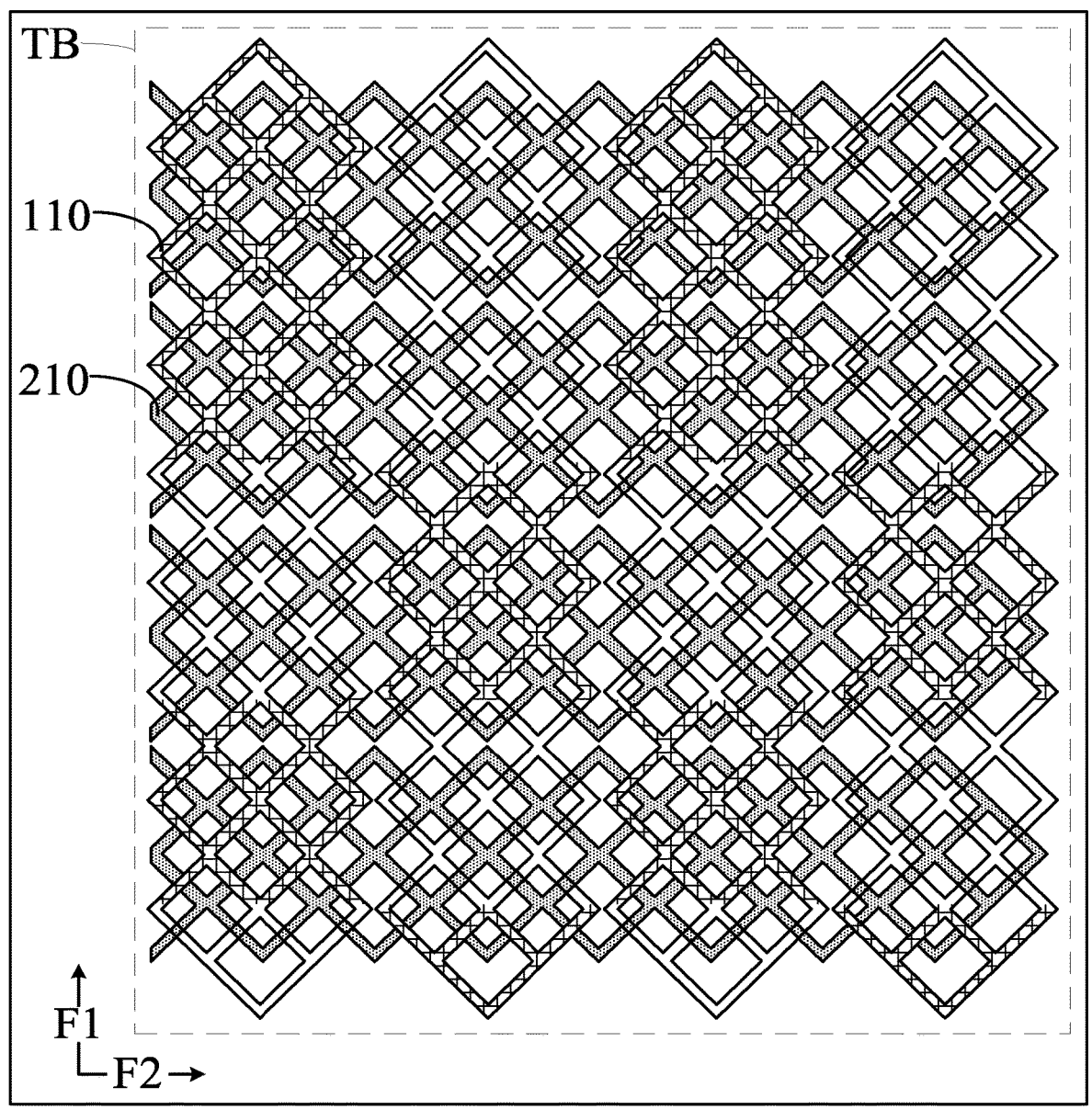
FIG. 1 is a schematic diagram of a structure of a touch substrate provided by an embodiment of the present disclosure.

In order to make objectives, technical solutions, and advantages of embodiments of the present disclosure clearer, the technical solutions of the embodiments of the present disclosure will be described clearly and completely in combination with accompanying drawings of the embodiments of the present disclosure. It is obvious that the described embodiments are a part of the embodiments of the present disclosure, but not all the embodiments. And in the case of no conflict, the embodiments in the present disclosure and characteristics in the embodiments can be combined with each other. Based on the described embodiments of the present disclosure, those skilled in the art can obtain other embodiment(s), without any inventive work, which all should be within the scope of the present disclosure.

Unless otherwise defined, technical or scientific terms used in the present disclosure shall have usual meanings understood by persons with general skills in the field to which the present disclosure belongs. "First", "second" and similar words used in the present disclosure do not indicate any order, quantity or importance, but are only used for distinguishing different components. "Include" or "comprise" and other similar words mean that elements or objects appearing before the word cover elements or objects and their equivalents listed after the word, but do not exclude other elements or objects. "Connect or "link" and other similar words are not limited to physical or mechanical connections, but may include electrical connections, whether direct or indirect.

It should be noted that the size and shape of each figure in the drawings do not reflect a true scale, and are only used for illustrating the content of the present disclosure. And same or similar reference numbers throughout indicate the same or similar elements or elements with same or similar functions.

In practical application, the touch substrates can be divided into a capacitance type, a resistance type, an infrared type, a surface acoustic wave type and the like according to working principles. Generally, the capacitive type touch substrates may include a mutual capacitive touch substrate and a self-capacitive touch substrate. As shown in FIG. 1, the mutual capacitive touch substrate may include a plurality of first touch control electrodes and a plurality of second touch control electrodes, and therefore a touch position can be determined through mutual capacitance formed between the first touch control electrodes and the second touch control electrodes. Generally, the first touch control electrodes extend in an F1 direction, and the second touch control electrodes extend in an F2 direction. The first touch control electrodes are connected to a driving integrated circuit (IC) via sensing signal lines, and the second touch control electrodes are connected to the driving IC via driving signal lines. Furthermore, the driving signal lines and the second touch control electrodes need to be electrically connected through the connection through holes. However, as an insulating layer made of an organic material is generally arranged between the layer where the driving signal lines are located and the layer where the second touch control electrodes are located, the size of the connecting through holes is large (for example, larger than 20 microns) due to limitation of technical preparation conditions and characteristics of the organic material, and thus ghosting shadows of the connecting through holes can be seen from the outside.

Therefore, embodiments of the present disclosure provide touch substrates which can solve the ghosting shadow problem of the connection through holes and achieve a shadow elimination effect.

Figure 2:
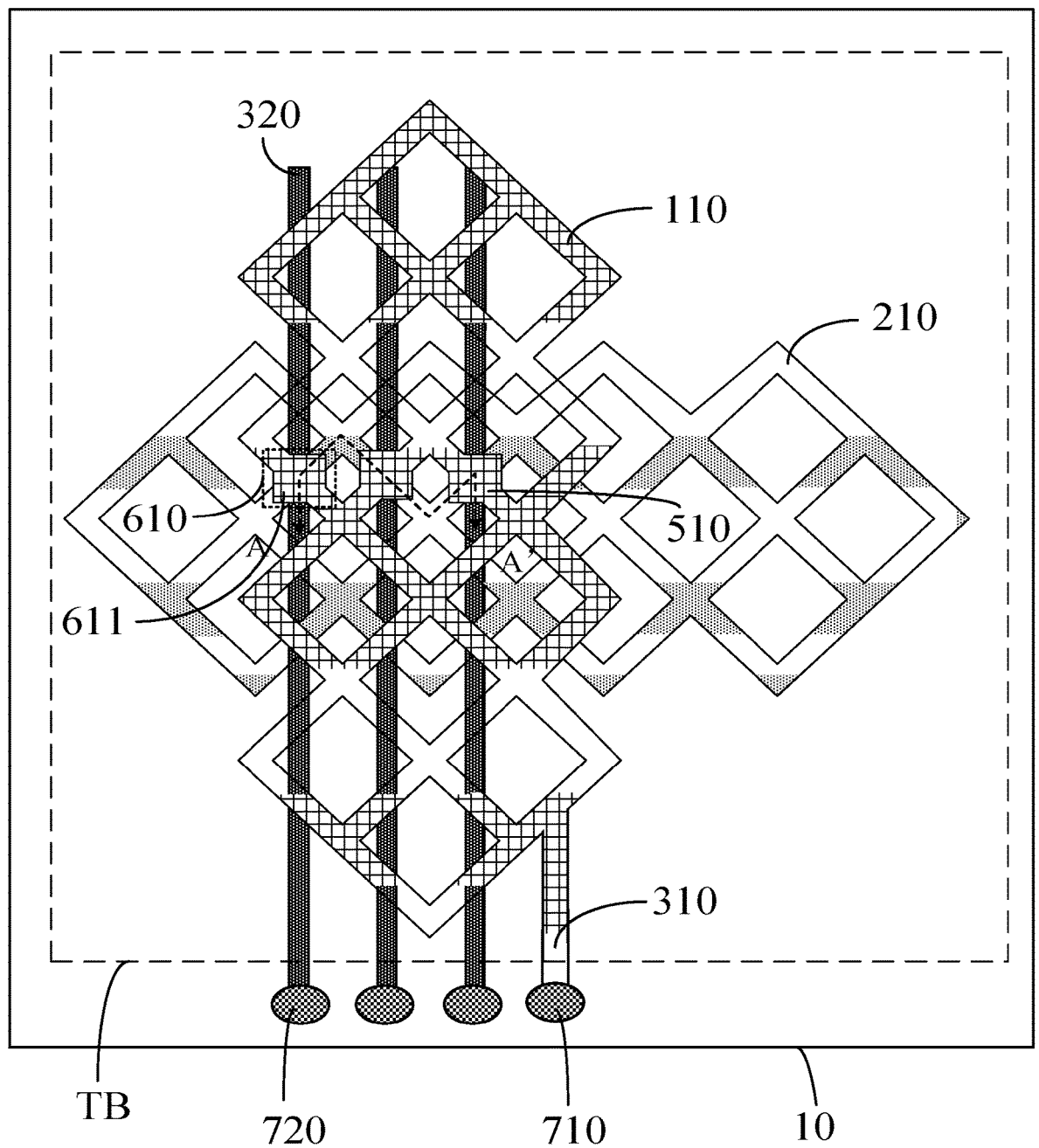
FIG. 2 is a schematic diagram of a local structure of a touch substrate provided by an embodiment of the present disclosure.
Figure 3:
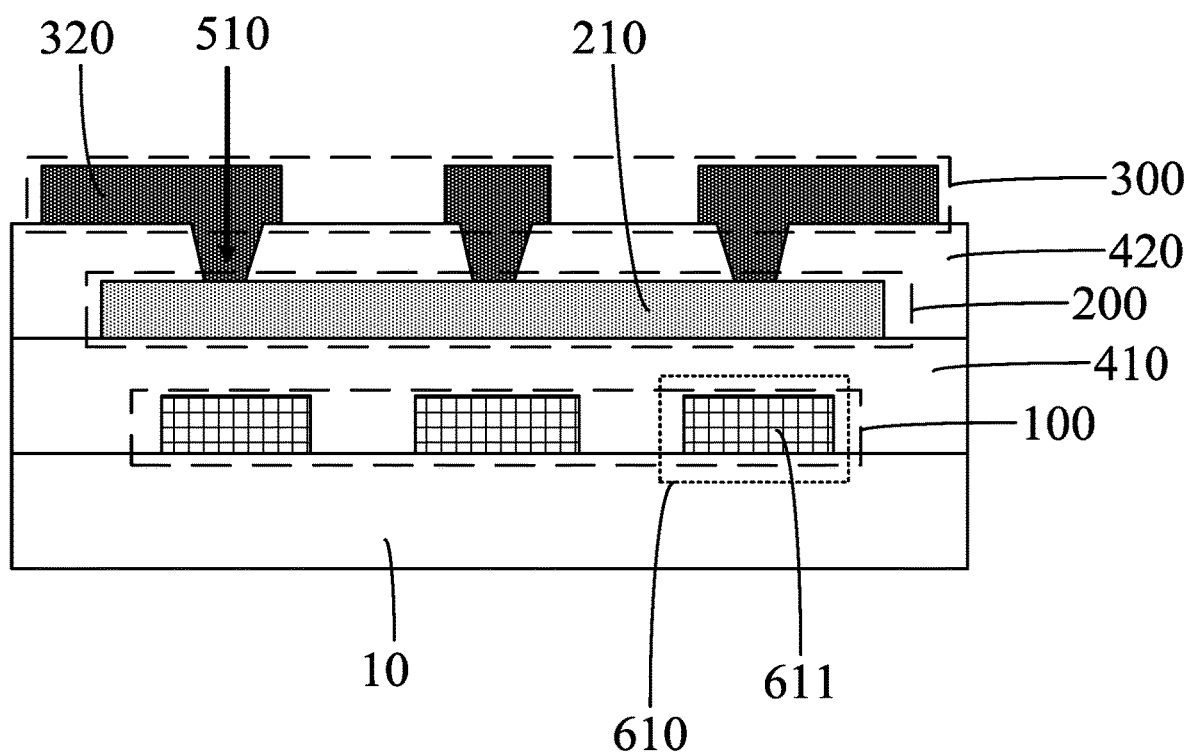
FIG. 3 is a schematic sectional diagram of a structure of the touch substrate shown in FIG. 2 in an AA' direction.

The touch substrate, as shown in FIG. 1 to FIG. 3, provided by some embodiments of the present disclosure may include:

a base substrate 10;

a first touch control electrode layer 100 on a side of the base substrate 10, the first touch control electrode layer 100 including a plurality of grid-shaped first touch control electrodes 110 arranged at intervals, and the first touch control electrodes 110 extending in a first direction F1;

a first insulating layer 410 on a side, facing away from the base substrate 10, of the first touch control electrode layer 100;

a second touch control electrode layer 200 on a side, facing away from the base substrate 10, of the first insulating layer 410, the second touch control electrode layer 200 including a plurality of grid-shaped second touch control electrodes 210 arranged at intervals, and the second touch control electrodes 210 extending in a second direction F2;

a second insulating layer 420 on a side, facing away from the base substrate 10, of the second touch control electrode layer 200, and the second insulating layer 420 being provided with a plurality of connection through holes 510; and a signal line layer 300 on a side, facing away from the base substrate 10, of the second insulating layer 420, the signal line layer 300 including a plurality of second signal transmission lines 320.

Each of the plurality of second touch control electrodes 210 is electrically connected to at least one of the plurality of second signal transmission lines 320 through at least one of the plurality of connection through holes 510.

Orthographic projections of the first touch control electrodes 110 on the base substrate 10 and orthographic projections of the second touch control electrodes 210 on the base substrate 10 have a plurality of first intersections. The connection through holes 510 each is arranged corresponding to positions of the respective first intersections, and orthographic projections of the connection through holes 510 on the base substrate 10 and orthographic projections of the first intersections on the base substrate 10 have overlapping regions.

The first touch control electrodes 110 at the first intersections have shadow elimination structures 610. Orthographic projections of the shadow elimination structures 610 on the base substrate 10 cover the orthographic projections of the connection through holes 510 on the base substrate 10.

According to the touch substrate provided by some embodiments of the present disclosure, the first touch control electrodes 110 are provided with the shadow elimination structures 610 at the first intersections, and the orthographic projections of the shadow elimination structures 610 on the base substrate 10 cover the orthographic projections of the connection through holes 510 on the base substrate 10, so that shadows of the connection through holes 510 can be shielded by the shadow elimination structures 610, when a user watches the touch substrate from the side, away from the signal line layer 300, of the base substrate 10, and thus the ghosting shadow problem of the connection through holes 510 can be solved. Furthermore, the first touch control electrodes 110 are set to be grid-shaped, so that the first touch control electrodes 110 can be more uniformly arranged on the base substrate 10, the shadow elimination structures 610 and the first touch control electrodes 110 are set to be of an integrated structure, then the user can be not prone to perceive the patterns of the shadow elimination structures 610, and thus the shadow elimination effect can be achieved.

It should be noted that in the embodiments of the present disclosure, the first touch control electrodes 110 are provided with the shadow elimination structures 610 at the first intersections, so that the first touch control electrodes 110 and the shadow elimination structures 610 are arranged on a same layer, the integrated structure is achieved, and thus arrangement of an additional film layer is not needed. Therefore, the thickness of the touch substrate in the direction perpendicular to the plane where the base substrate 10 is located can be reduced. Then, when the touch substrate provided by the embodiments of the present disclosure is applied to a touch display device, the thickness of the touch display device can be reduced.

And generally, the touch control display panel is provided with a display region, so that in order to enable the display region to achieve a touch control function, as shown in FIG. 1, the touch substrate is provided with an effective touch control region TB corresponding to the display region, and the effective touch control region TB is provided with the first touch control electrodes 110 and the second touch control electrodes 210. In actual application, the effective touch control region TB can cover the display region, and thus the display region can achieve the touch control function.

It should be noted that in the embodiments of the present disclosure, the orthographic projections of the first intersections on the base substrate 10 and the orthographic projections of the connection through holes 510 on the base substrate 10 have overlapping regions, that is, each connection through hole 510 is correspondingly arranged in the position where the corresponding first intersection is located.

In specific implementation, in some embodiments of the present disclosure, as shown in FIG. 2 and FIG. 3, orthographic projections of grid points of grid-shaped patterns of the first touch control electrodes 110 on the base substrate 10 are not overlapped with orthographic projections of grid points of the grid-shaped patterns of the second touch control electrodes 210 on the base substrate 10. Therefore, orthographic projections of the grid-shaped patterns of the first touch control electrodes 110 on the base substrate 10 and orthographic projections of the grid-shaped patterns of the second touch control electrodes 210 on the base substrate 10 have fewer overlapping regions, so that influences of the first touch control electrodes 110 and the second touch control electrodes 210 on display can be reduced, and a display effect can be improved.

In specific implementation, in some embodiments of the present disclosure, one second touch control electrode 210 can be correspondingly electrically connected to at least one second signal transmission line 320. Exemplarily, as shown in FIG. 2 and FIG. 3, one second touch control electrode 210 can be correspondingly electrically connected to three second signal transmission lines 320. Or, one second touch control electrode 210 can be correspondingly electrically connected to one, four or more second signal transmission lines 320. Of course, in actual application, the number of the second signal transmission lines 320 to be electrically connected to one second touch control electrode 210 can be designed and determined according to actual application requirements, and is not limited here.

In specific implementation, in some embodiments of the present disclosure, the touch substrate may also include a plurality of first signal transmission lines. One first touch control electrode 110 may be correspondingly electrically connected to at least one first signal transmission line. Exemplarily, as shown in FIG. 2, one first touch control electrode 110 may be correspondingly electrically connected to one first signal transmission line 310. Or, one first touch control electrode 110 may be correspondingly electrically connected to two, three, four or more first signal transmission lines. Of course, in actual application, the number of the first signal transmission lines to be electrically connected to one first touch control electrode 110 may be designed and determined according to actual application requirements, and is not limited here.

In specific implementation, in some embodiments of the present disclosure, as shown in FIG. 2 and FIG. 3, the touch substrate may also include a binding region that is provided with a plurality of first binding terminals and a plurality of second binding terminals. The first binding terminals and the second binding terminals are bound to a driving IC. Furthermore, one first signal transmission line is correspondingly electrically connected to one first binding terminal, and one second signal transmission line 320 is correspondingly electrically connected to one second binding terminal. Therefore, the driving IC can carry out signal transmission with the first touch control electrodes 110 through the first binding terminals and the first signal transmission lines, and the driving IC can carry out signal transmission with the second touch control electrodes 210 through the second binding terminals and the second signal transmission lines 320.

In specific implementation, in some embodiments of the present disclosure, as shown in FIG. 2 and FIG. 3, the first touch control electrodes 110 can extend in a first direction F1 and be arranged in a second direction F2. The second touch control electrodes 210 extend in the second direction F2 and are arranged in the first direction F1. Exemplarily, the first direction F1 may be the column direction of sub-pixels in the touch control display panel, and the second direction F2 may be the row direction of the sub-pixels in the touch control display panel. Of course, in actual application, the first direction F1 and the second direction F2 can be set according to actual application requirements, and are not limited here.

In specific implementation, in some embodiments of the present disclosure, as shown in FIG. 2 and FIG. 3, the first signal transmission lines 310 and the second signal transmission lines 320 can extend in the first direction F1. Of course, in actual application, the first signal transmission lines 310 and the second signal transmission lines 320 can be set according to actual application requirements, and are not limited here.

In specific implementation, in some embodiments of the present disclosure, as shown in FIG. 2 and FIG. 3, each shadow elimination structure 610 may include a first planar structure 611. The first planar structures 611 and the first touch control electrodes 110 are arranged on the same layer, and the wire widths of the first touch control electrodes 110 in the region where the first planar structures 611 are located are larger than those of the first touch control electrode 110 in other regions. And the orthographic projections of the first planar structures 611 on the base substrate 10 cover the orthographic projections of the connection through holes 510 on the base substrate 10. In this way, positions, corresponding to the connection through holes 510, in the first touch control electrodes 110 can be thickened to form the first planar structures 611, so that the connection through holes 510 can be shielded by the first planar structures 611, and thus the shadow elimination effect can be achieved. Of course, in actual application, the area of the first planar structure 611 can be designed and determined according to actual application requirements, and is not limited here.

It should be noted that the wire widths of the first touch control electrode 110 refer to the widths of grid lines of the grid-shaped first touch control electrode 110. Of course, in actual application, the width of the grid lines of the first touch control electrodes 110 may be roughly the same as or different from the width of the grid lines of the second touch control electrodes 210, the width of the grid lines can be designed and determined according to actual application requirements, and is not limited here.

In actual application, the touch substrate may be combined with the display panel, that is, the first touch control electrodes and the second touch control electrodes can be arranged in the display region of the display panel, and thus the display region of the display panel can achieve the touch control function. In actual application, along with increasing of the size of the touch substrate, the large-size touch substrate has extremely high requirement on resistance of the first touch control electrodes 110 and the second touch control electrodes 210. In order to reduce the resistance on the electrode layers, in some embodiments of the present disclosure, the material of the first touch control electrodes 110 and the second touch control electrodes 210 can be set to be a metal material, such as gold, silver and aluminum, which is not limited here.

In specific implementation, in some embodiments of the present disclosure, as shown in FIG. 2 and FIG. 3, the orthographic projections of the first planar structures 611 on the base substrate 10 can be roughly set to be rectangular in shape. Of course, in actual application, the shape of the orthographic projections of the first planar structures 611 on the base substrate 10 can be set according to actual application requirements, and is not limited here.

Figure 4:
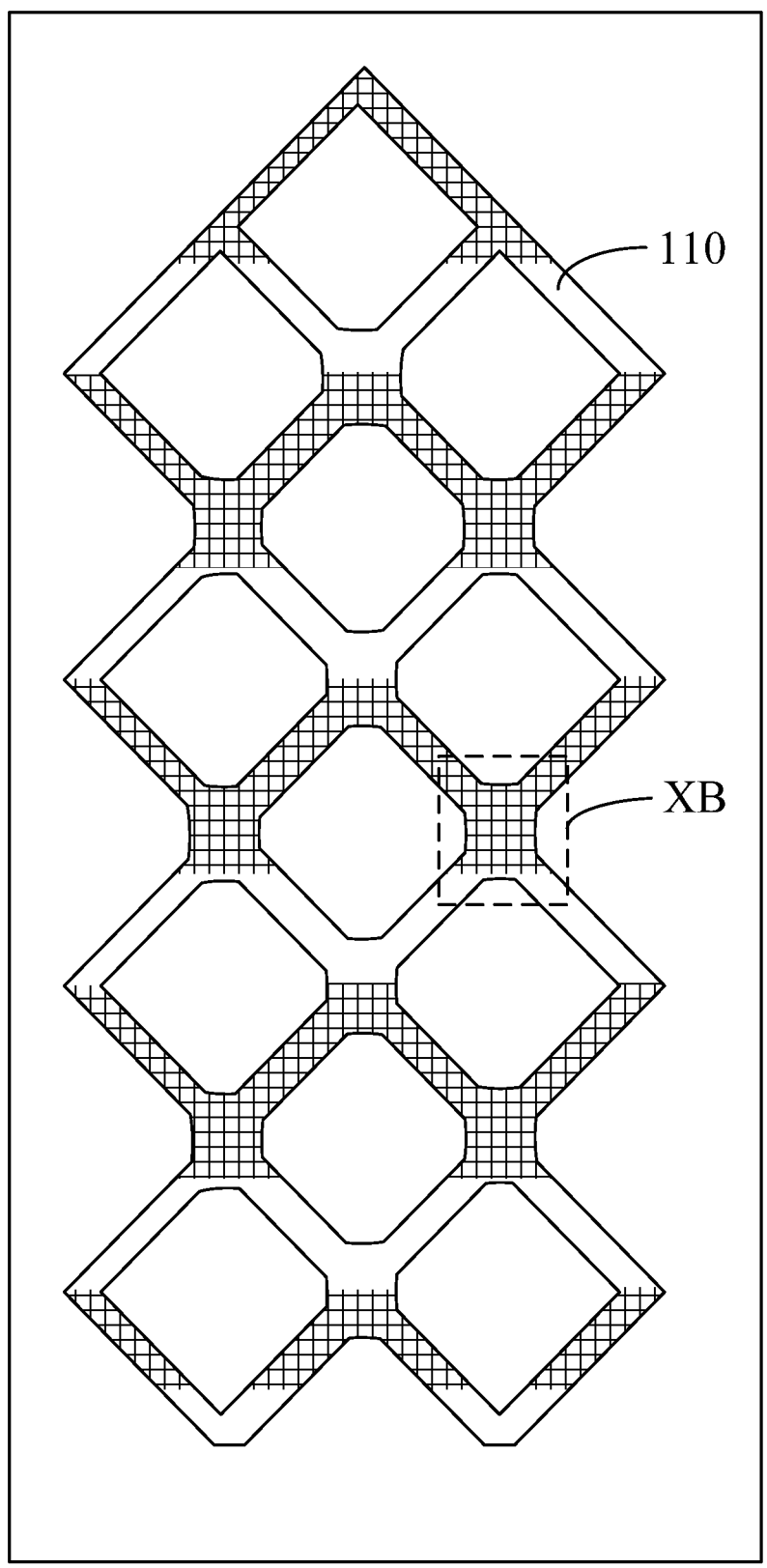
FIG. 4 is a schematic diagram of a local structure of a first touch control electrode provided by an embodiment of the present disclosure.

In actual application, the grid-shaped patterns of the first touch control electrodes 110 and the grid-shaped patterns of the second touch control electrode 210 can respectively formed through a patterning process. Exemplarily, the above-mentioned patterning process may include a photoetching process and an etching process. The photoetching process is the process of forming patterns by using photoresist, mask plates and exposure machines during technological processes such as film building, exposing and developing. However, during an actual technical preparation process, when the grid-shaped patterns are formed on the same layer, for example, when the grid-shaped patterns of the first touch control electrodes 110 are formed, in combination with FIG. 4, due to the limitation of technical conditions, and the problem of exposure diffraction, the region XB where each formed intersection of the grid-shaped patterns of the first touch control electrodes 110 is located may generate a metal block resembling a rectangle. The grid-shaped patterns of the first touch control electrodes 110 are uniformly distributed in the touch control region TB, so that the metal blocks resembling the rectangles can also be uniformly distributed in the touch control region TB, then the metal blocks are not prone to be perceived by human eyes, and thus the ghosting shadow problem generated by the metal blocks can be ignored. That is, the influence of the metal blocks on the display effect is ignored, and the setting is that the metal blocks do not influence the display effect. Furthermore, the setting mode of the second touch control electrodes 210 is the same and not repeated here. It should be noted that the metal blocks are not shown in FIG. 1 and FIG. 2.

Figure 5:
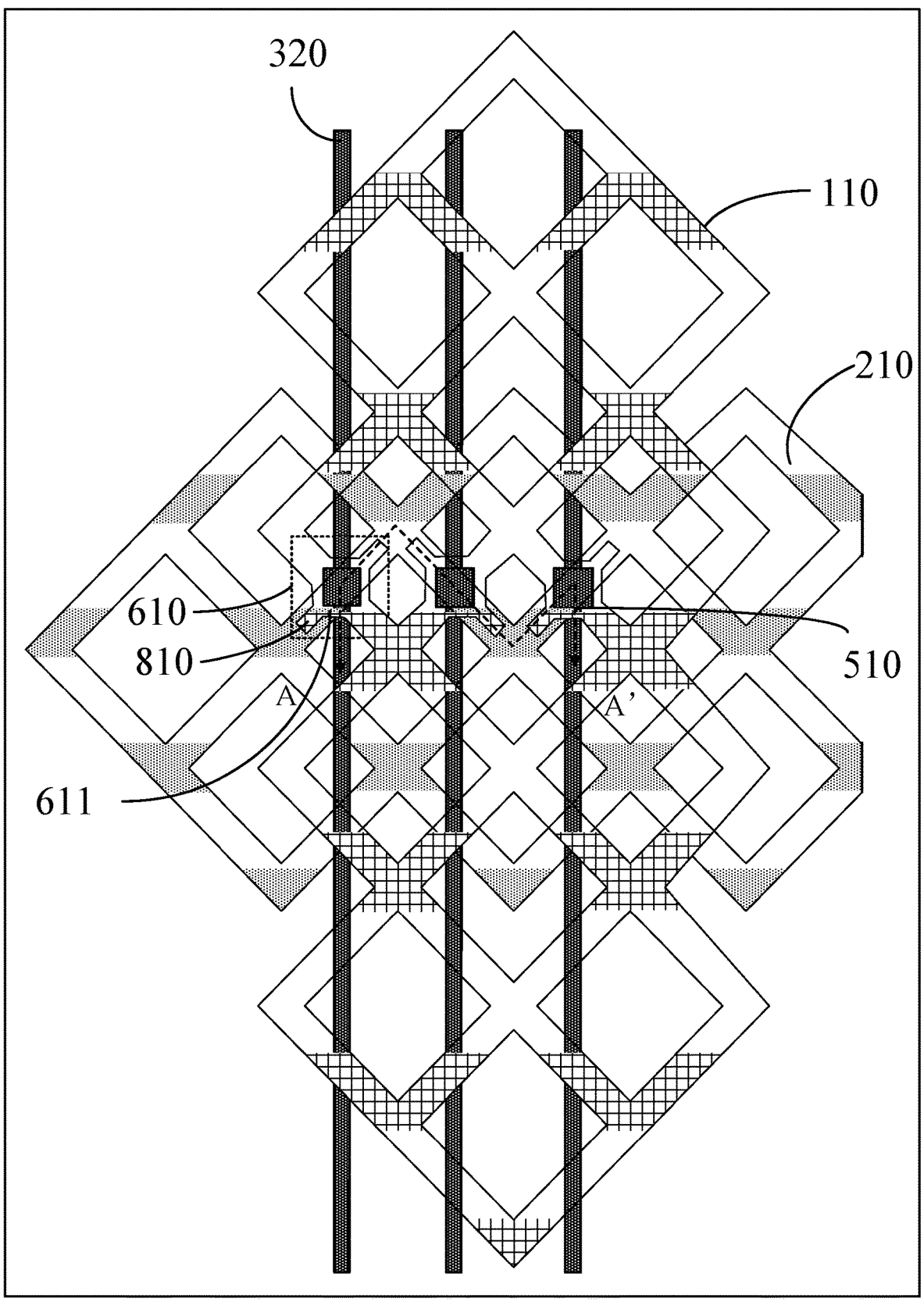
FIG. 5 is a schematic diagram of a local structure of another touch substrate provided by an embodiment of the present disclosure.

The metal blocks of the first touch control electrodes 110 appear during the technical preparation process, so that the metal blocks can be used for shielding the connection through holes 510 in some embodiments of the present disclosure. In specific implementation, in some embodiments of the present disclosure, as shown in FIG. 5 to FIG. 6B, the shadow elimination structures 610 further include a plurality of strip-shaped first conductive parts 810. The first conductive parts 810 and the first planar structures 611 can be arranged on the same layer. Furthermore, in the same shadow elimination structure 610, the orthographic projection of the first conductive part 810 on the base substrate 10 and the orthographic projection of the first planar structure 611 on the base substrate 10 are arranged in a crossed mode. Therefore the first conductive parts 810 intersecting the grid lines can be arranged at the positions, corresponding to the connection through holes 510, of the grid lines of the original first touch control electrodes 110, so that the metal blocks can be formed at the positions of the intersections of the first touch control electrodes 110 and the first conductive parts 810 by the aid of exposure diffraction, and thus the formed metal blocks serve as the first planar structures 611 in the embodiments of the present disclosure. Therefore, the first planar structures 611 can be formed with no need to change the common technical preparation process. Of course, in actual application, the area of the first planar structure 611 formed by setting the first conductive part 810 can be designed and determined according to actual application requirements, and is not limited here.

In specific implementation, in some embodiments of the present disclosure, as shown in FIG. 5, the orthographic projections of the second touch control electrodes 210 on the base substrate 10 cover the orthographic projections of the first conductive parts 810 on the base substrate 10. Therefore, influences of the first conductive parts 810 on display can be reduced.

Figure 6A:
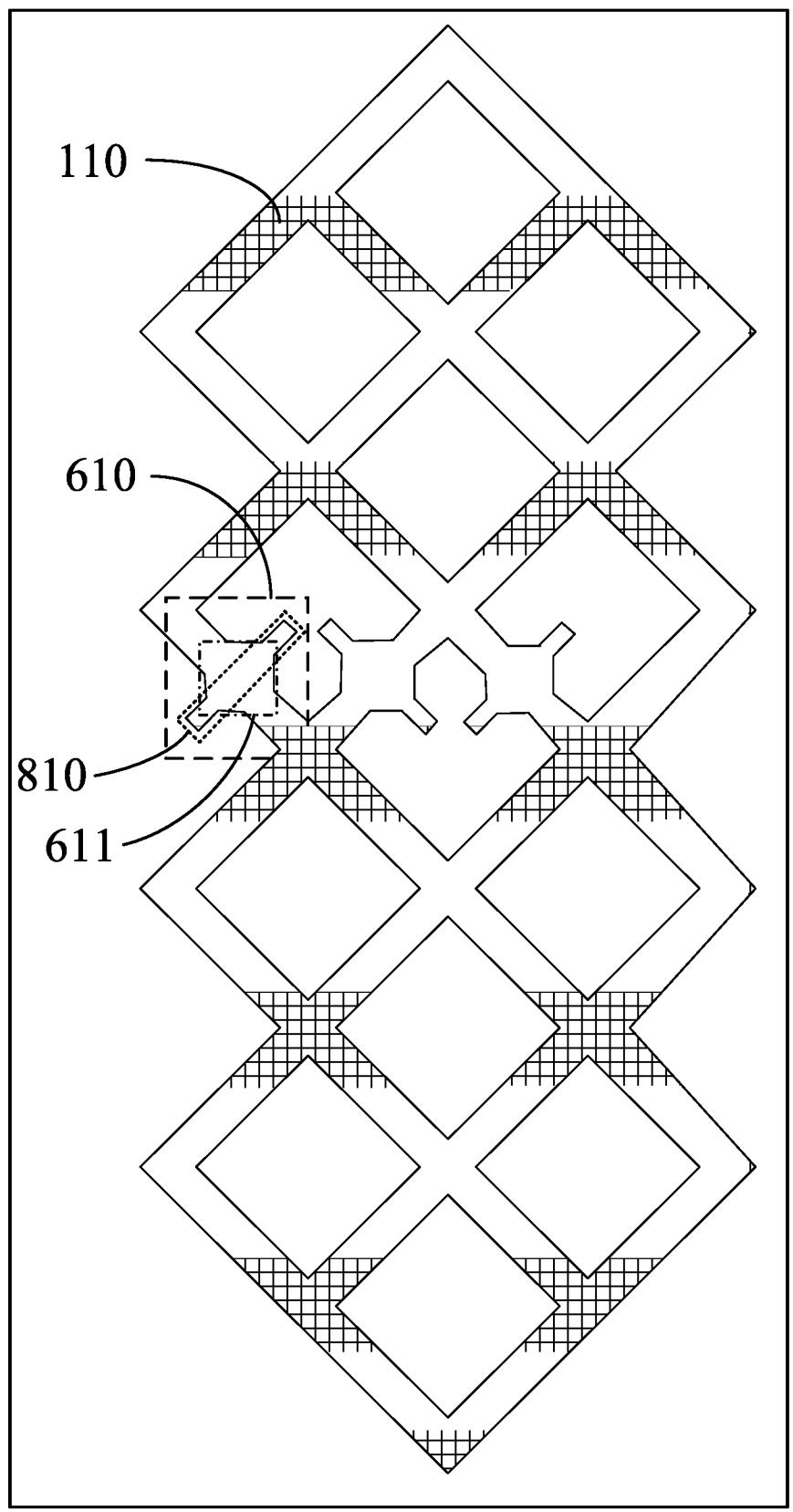
FIG. 6A is a schematic diagram of a structure of a first touch control electrode in the touch substrate shown in FIG. 5.
Figure 6B:
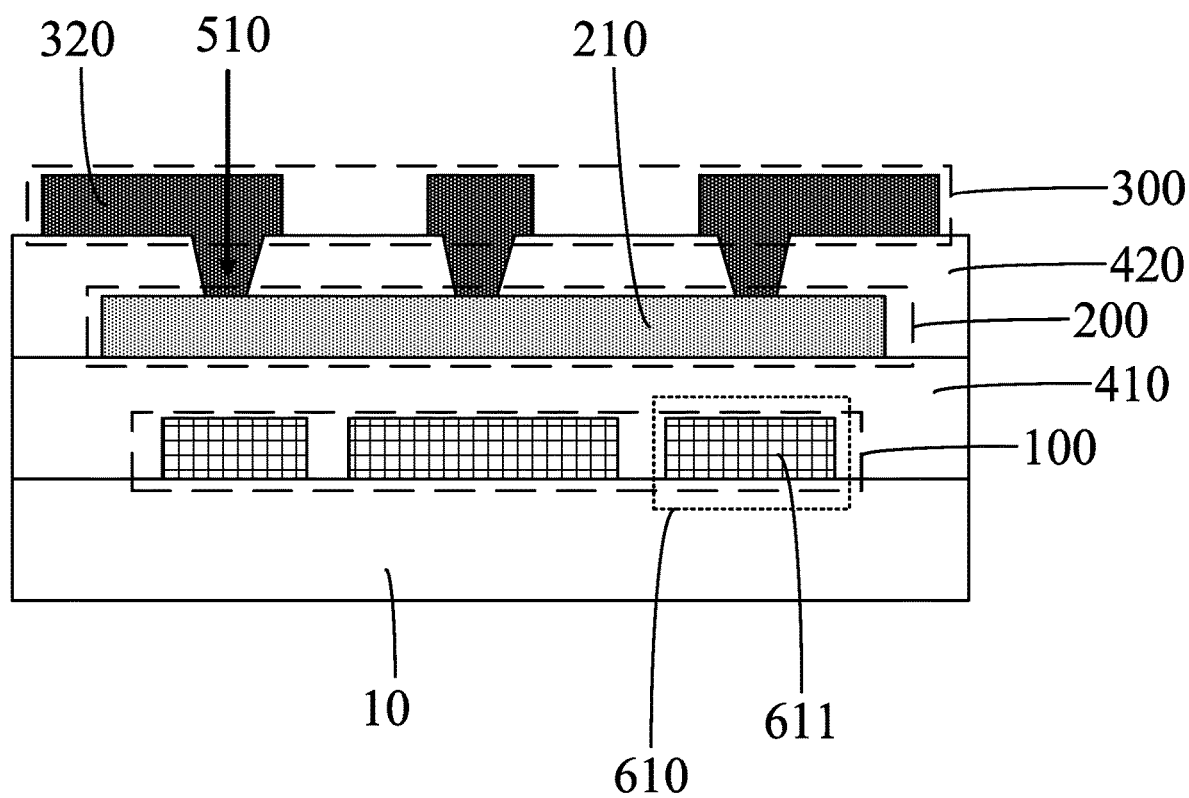
FIG. 6B is a schematic sectional diagram of a structure of the touch substrate shown in FIG. 5 in an AA' direction.

In specific implementation, in some embodiments of the present disclosure, as shown in FIG. 5 and FIG. 6A, in the same first touch control electrode, the orthographic projection of the first conductive part 810 on the base substrate 10 is not in contact with the orthographic projections of other grids except the grid(s) of the first touch control electrode 110 in contact with the first conductive part 810 on the base substrate 10. In this way, the first conductive part 810 can be in direct contact with the grid(s) of the first touch electrode 110 where the first conductive part 810 is located, and the first conductive part 810 is not in contact with the other grids except the grid(s) of the first touch control electrode 110 where the first conductive part 810 is located, so that the first conductive part 810 can be only arranged at the first intersection.

Figure 7:
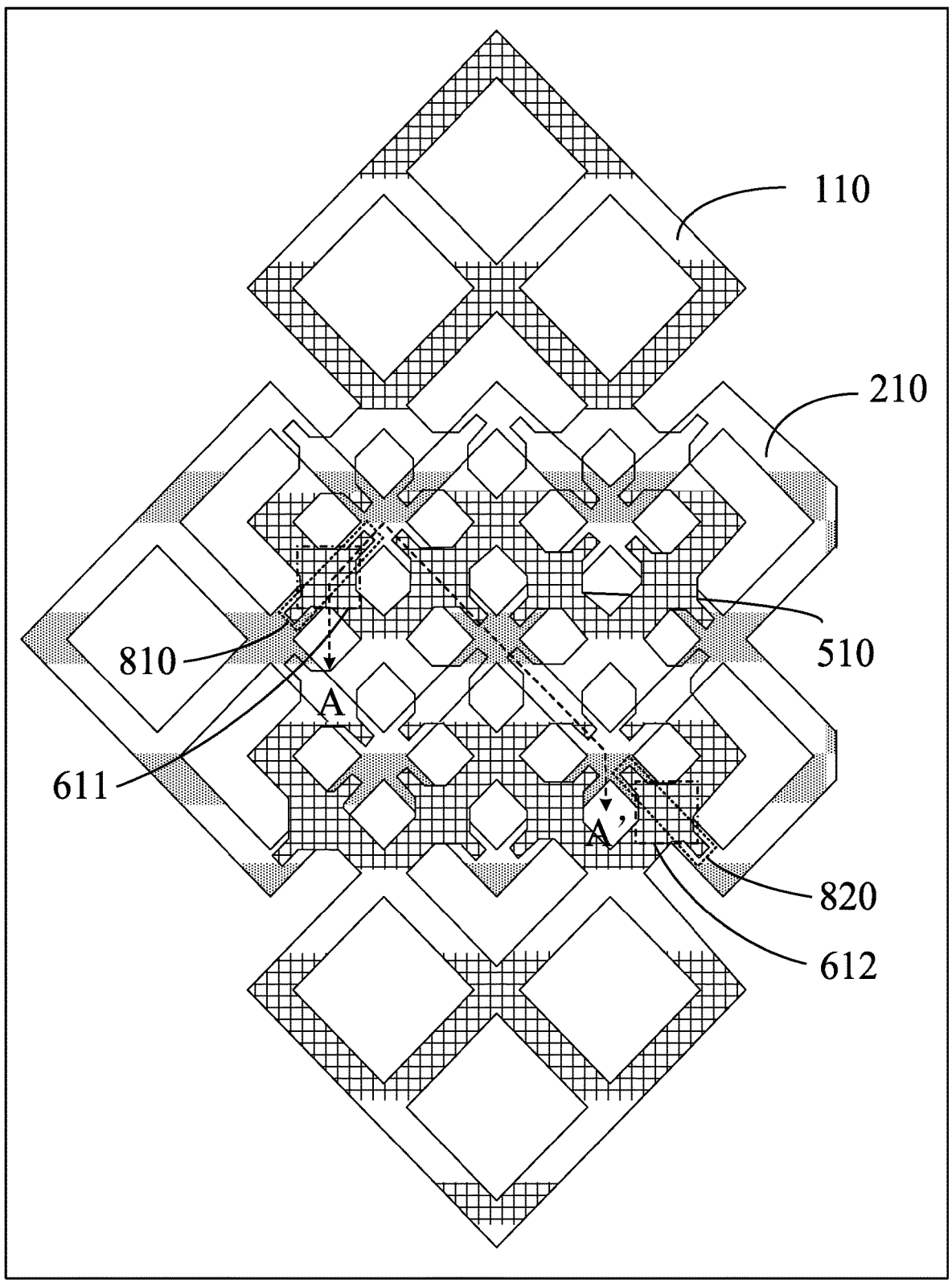
FIG. 7 is a schematic diagram of a local structure of another touch substrate provided by an embodiment of the present disclosure.
Figure 8A:
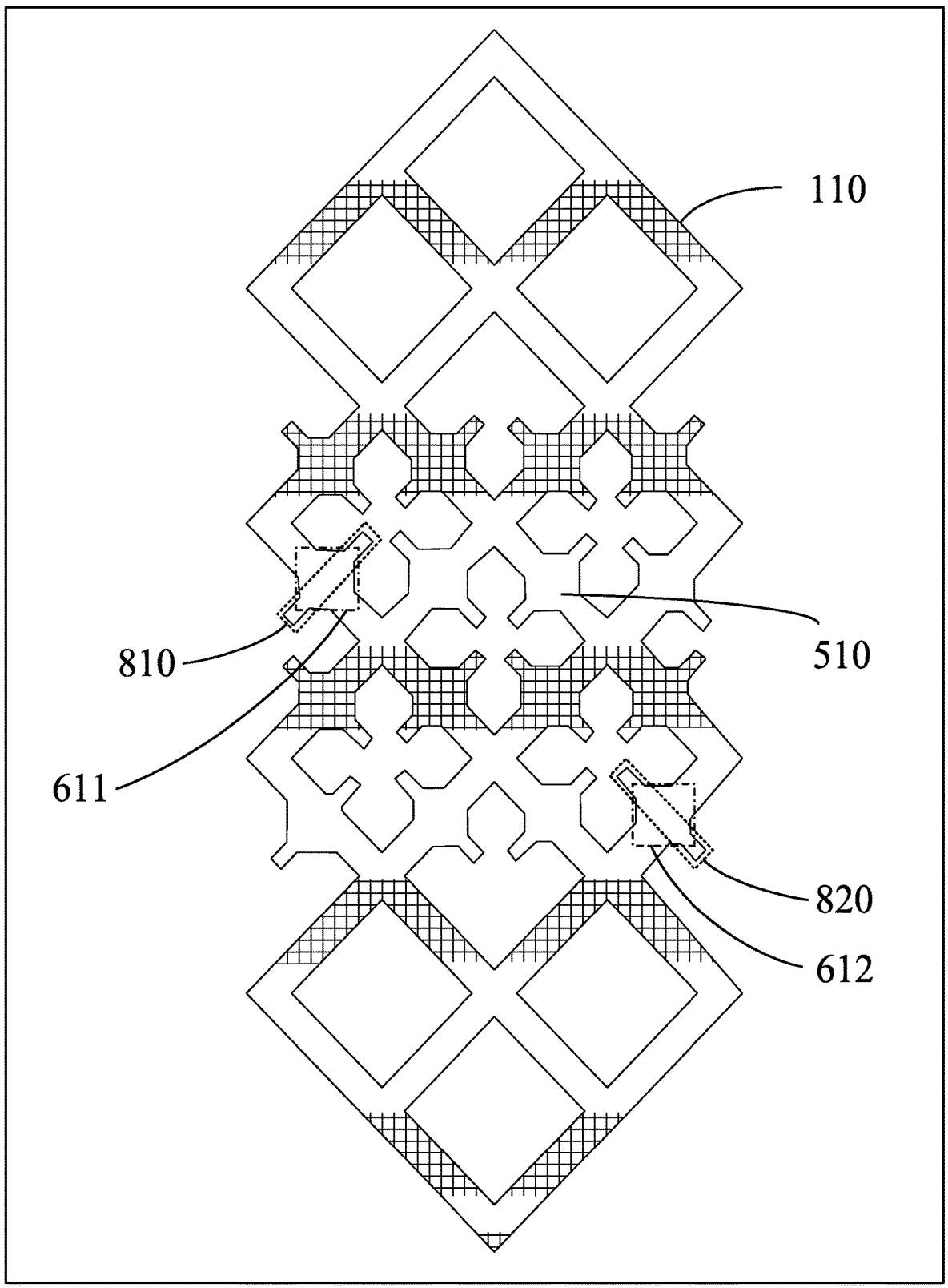
FIG. 8A is a schematic diagram of a structure of a first touch control electrode in the touch substrate shown in FIG. 7.
Figure 8B:
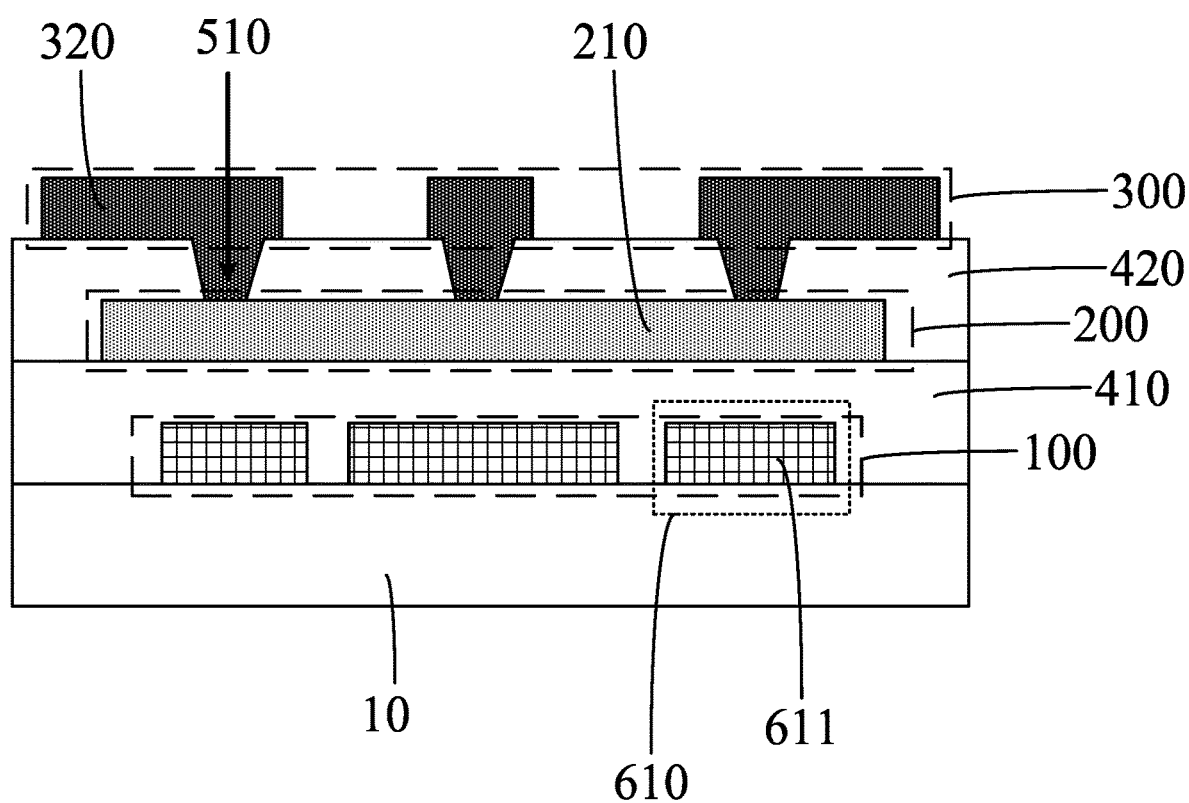
FIG. 8B is a schematic sectional diagram of a structure of the touch substrate shown in FIG. 7 in an AA' direction.

In specific implementation, in some embodiments of the present disclosure, as shown in FIG. 5 to FIG. 8B, the orthographic projections of the first touch control electrodes 110 on the base substrate 10 and the orthographic projections of the second touch control electrodes 210 on the base substrate 10 have a plurality of second intersections. The orthographic projections of the second intersections on the base substrate 10 are not overlapped with the orthographic projections of the connection through holes 510 on the base substrate 10. That is, the connection through holes 510 are not correspondingly arranged corresponding to the positions of the second intersections. Furthermore, as shown in FIG. 7 to FIG. 8b, the touch substrate may further include a plurality of second planar structures 612 arranged on the same layer with the first touch control electrodes 110. The orthographic projection of one second intersection on the base substrate 10 and the orthographic projection of the corresponding second planar structure 612 on the base substrate 10 have an overlapping region. Both the first intersections and the second intersections are intersections of the first touch control electrodes 110 and the second touch control electrodes 210, and the intersections of the first touch control electrodes 110 and the second touch control electrodes 210 are uniformly arranged, so that the first planar structures 611 and the second planar structures 612 can be uniformly and periodically distributed in the effective touch control region by arranging the first planar structures 611 at the first intersections and arranging the second planar structures 612 at the second intersections, and thus the first planar structures 611 can be further not perceived by human eyes, and the shadow elimination effect can be further improved.

In specific implementation, in some embodiments of the present disclosure, as shown in FIG. 7 to FIG. 8b, the orthographic projections of the first planar structures 611 on the base substrate 10 and the orthographic projections of the second planar structures 612 on the base substrate 10 are substantially the same in shape and size. In this way, the first planar structures 611 and the second planar structures 612 can be further uniformly and periodically distributed in the effective touch control region, and thus the first planar structures 611 can be further not perceived by the human eyes, and the shadow elimination effect can be further improved.

In specific implementation, in some embodiments of the present disclosure, as shown in FIG. 7 to FIG. 8b, the touch substrate may further include a plurality of strip-shaped second conductive parts 820 arranged on the same layer with the first touch control electrodes 110. The orthographic projection of one second intersection on the base substrate 10 is partially overlapped with the orthographic projection of the corresponding second planar structure 612 on the base substrate 10. In this way, the second conductive parts 820 intersecting the grid lines can be arranged at the positions, corresponding to the second intersections, of the grid lines of the original first touch control electrodes 110, so that the metal blocks can be formed at the positions of the intersections of the first touch control electrodes 110 and the second conductive parts 820 with the aid of the exposure diffraction, and thus the formed metal blocks serve as the second planar structures 612 in the embodiments of the present disclosure. In this way, the second planar structures 612 can be formed with no need to change the common technical preparation process. Of course, in actual application, the area of the second planar structure 612 formed by setting the second conductive part 820 can be designed and determined according to actual application requirements, and is not limited here.

In specific implementation, in some embodiments of the present disclosure, as shown in FIG. 7, the orthographic projections of the second touch control electrodes 210 on the base substrate 10 cover the orthographic projections of the second conductive parts 820 on the base substrate 10. Therefore, influences of the second conductive parts 820 on display can be reduced.

In specific implementation, in some embodiments of the present disclosure, as shown in FIG. 7, the orthographic projections of the second conductive parts 820 on the base substrate 10 are not overlapped with the orthographic projections of the first conductive parts 810 on the base substrate 10. Therefore, the first conductive parts 810 and the second conductive parts 820 can be arranged at intervals.

Figure 9:
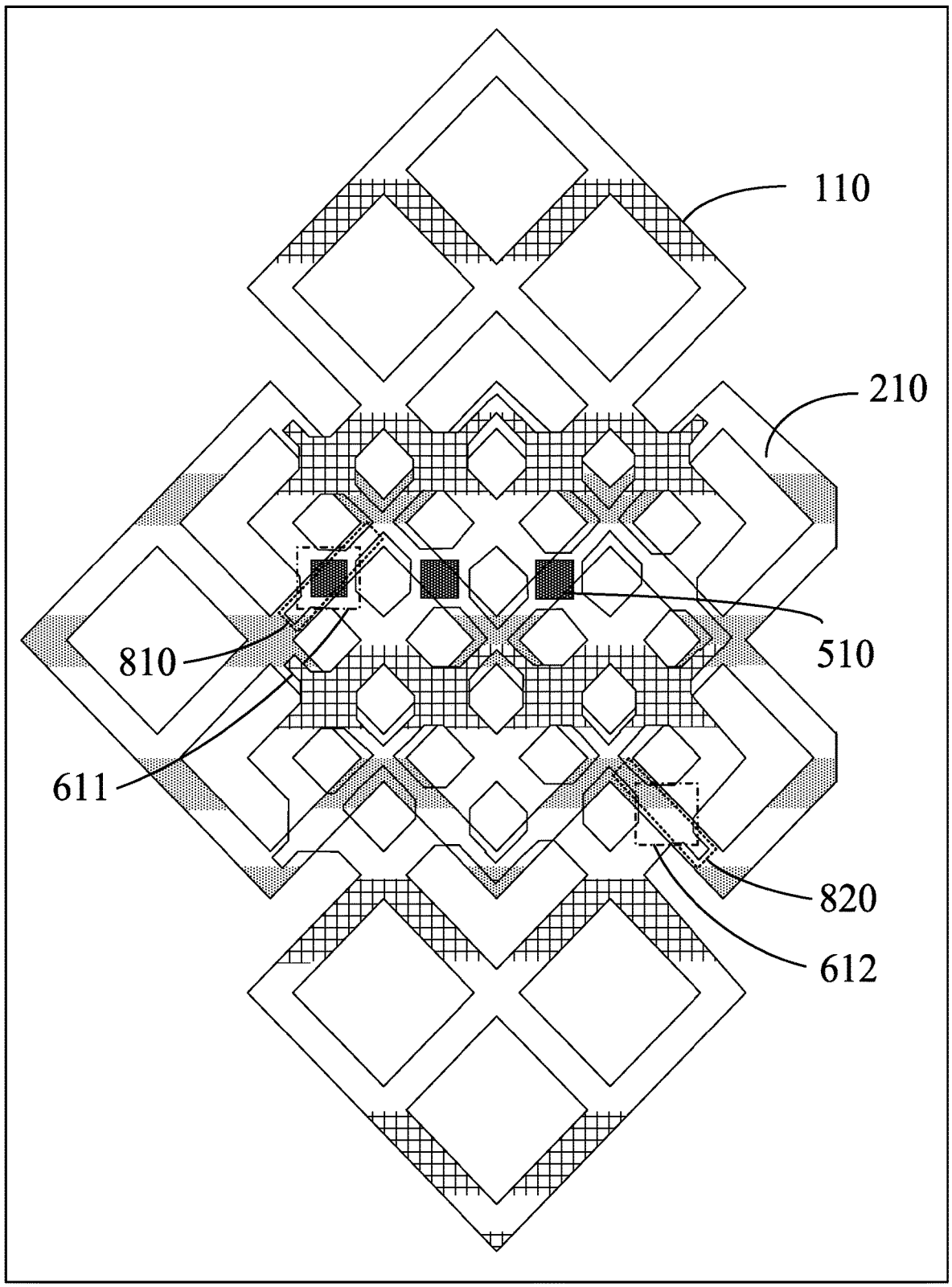
FIG. 9 is a schematic diagram of a local structure of another touch substrate provided by an embodiment of the present disclosure.

In specific implementation, in some embodiments of the present disclosure, as shown in FIG. 9, each first conductive part 810 and the corresponding second conductive part in the same first touch control electrode 110 can be directly electrically connected. Furthermore, in the same first touch control electrode 110, the orthographic projections of all the first conductive parts 810 and second conductive parts on the base substrate 10 are located in the orthographic projections of the second touch control electrodes 210 on the base substrate 10. In this way, influences of the second conductive parts 820 on display can be reduced.

It should be noted that in actual technologies, due to limitation of technical conditions or other factors, sameness described in the features above cannot be completely identical and may have some deviations, so that sameness relation between the features described above are within the scope of the present disclosure as long as the conditions described above are substantially met. The sameness may be, for example, sameness permitted within an error-permissible range.

Based on a same inventive concept, the touch display device further provided by some embodiments of the present disclosure includes the touch substrate provided by the embodiments of the present disclosure. The principle of the solution of the touch display device is similar to that of the above-mentioned touch substrate, so that implementation of the touch display device can refer to that of the above-mentioned touch substrate, and repetitive points will not be repeated here.

Figure 10A:
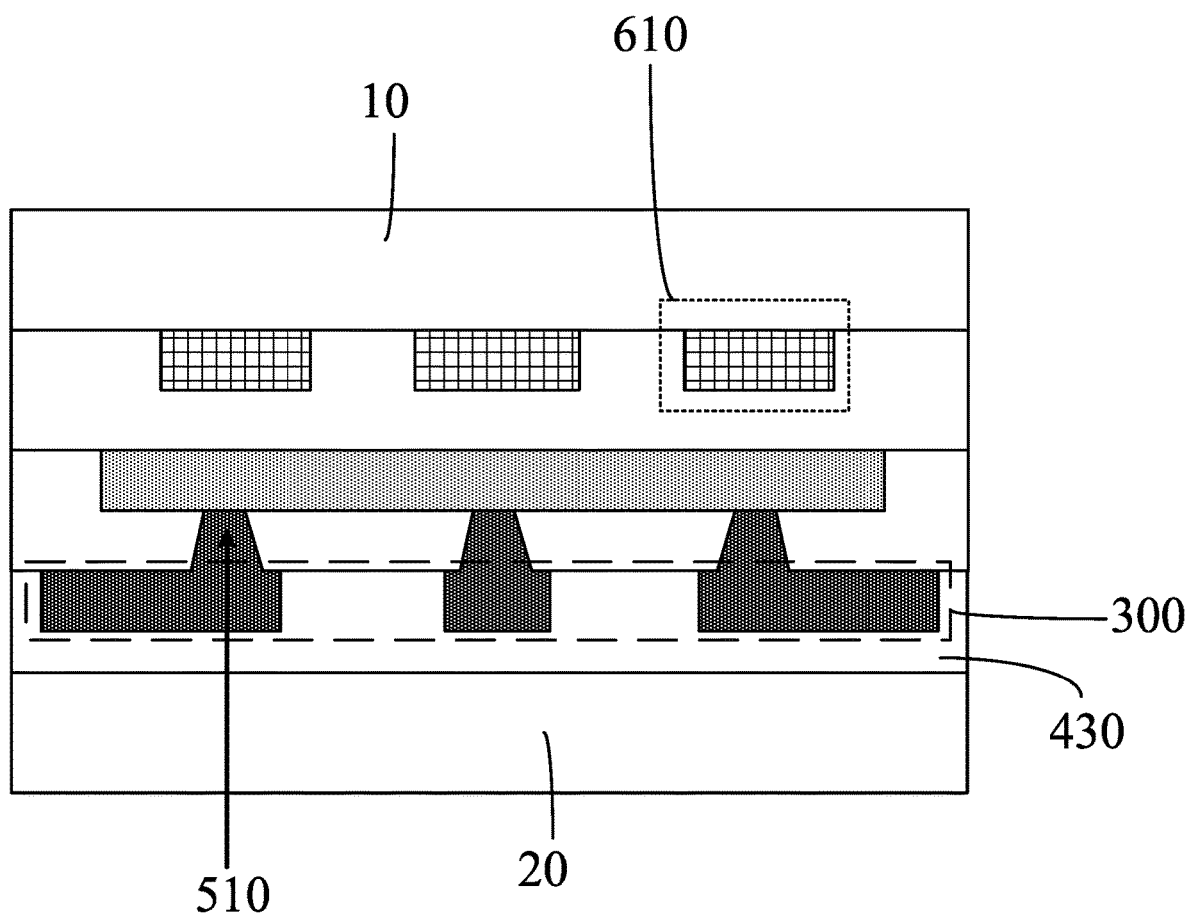
FIG. 10A is a schematic diagram of a structure of a touch display device provided by an embodiment of the present disclosure.

In specific implementation, in some embodiments of the present disclosure, as shown in FIG. 10A, the touch display device may further include a display panel 20, and the touch substrate is on the light emitting side of the display panel 20. The touch substrate is the above-mentioned touch substrate. Furthermore, the base substrate 10 is on the side, facing away from the display panel, of the signal line layer 300. Furthermore, a third insulating layer 430 is further arranged between the signal line layer 300 and the display panel 20. It should be noted that the structure and working principle of the touch substrate may refer to the above embodiments of the touch substrate, and specifically, will not be described in detail herein.

In specific implementation of the present disclosure, the first insulating layer, the second insulating layer, and the third insulating layer may be made of an inorganic material or organic material. Exemplarily, when the second insulating layer is made of the organic material, the size of the connection through hole is relatively large due to characteristics of the organic material and limitation of technical conditions. In the embodiments of the present disclosure, through arrangement of the shadow elimination structures, the shadow elimination effect of the connection through holes can be achieved.

In specific implementation of the present disclosure, the display panel may include a plurality of pixel units arranged in an array in the display region. Each pixel unit includes a plurality of sub-pixels. Exemplarily, the pixel units may include red sub-pixels, green sub-pixels and blue sub-pixels, so that red, green and blue can be mixed to achieve colored display. Or, the pixel units may include red sub-pixels, green sub-pixels, blue sub-pixels, and white sub-pixels, so that red, green, blue, and white can be mixed to achieve colored display. Of course, in actual application, the light emitting colors of the sub-pixels in the pixel unit can be designed and determined according to actual application requirements, and are not limited here.

In specific implementation of the present disclosure, the complete touch display device can be formed by fitting the touch substrate and the display panel through an adhesive material. In actual application, a user generally watches the touch display device on the side, away from the display panel, of the base substrate 10. In the embodiments of the present disclosure, the shadow elimination structures are arranged, and thus the shadow elimination effect can be achieved.

Electroluminescent diodes such as organic light emitting diodes (OLEDs) and quantum dot light emitting diodes (QLEDs) have the advantages of self-luminescence, low energy consumption and the like; and the display panel can be an electroluminescent display panel in specific implementation. In some embodiments of the present disclosure, the sub-pixel in the electroluminescent display panel may include the electroluminescent diode and a driving circuit used for driving the electroluminescent diode to emit light. The electroluminescent diode includes an anode, a light-emitting layer and a cathode which are arranged in a stacked mode. Furthermore, the electroluminescent diode may include at least one of the OLED and the QLED. Moreover, the driving circuit generally may include a plurality of transistors such as a driving transistor and a switching transistor, and a storage capacitor; the specific structure and the working principle of the driving circuit can be the same as those in the prior art, and are not repeated here.

A liquid crystal display (LCD) panel has the characteristics of light and thin appearance, power saving, no radiation and the like, and is widely applied. The working principle of the LCD panel is that an arrangement state of liquid crystal molecules in a liquid crystal layer is changed by changing a voltage difference between two ends of the liquid crystal layer, so that light transmittance of the liquid crystal layer is changed to display images. In specific implementation, the display panel may be a liquid crystal display panel. In some embodiments of the present disclosure, each sub-pixel may include a pixel electrode located on an array substrate and a thin film transistor (TFT) electrically connected to the pixel electrode. Of course, a grid line for transmitting grid scanning signals and a data line for transmitting data signals are also arranged on the array substrate. In this way, the grid scanning signal is input to the TFT through the grid line to control the TFT to be conducted, so that the data signal transmitted on the data line is input into the pixel electrode, and thus voltage is input into the pixel electrode, and then the liquid crystal molecules are driven to rotate to display the image.

Figure 10B:
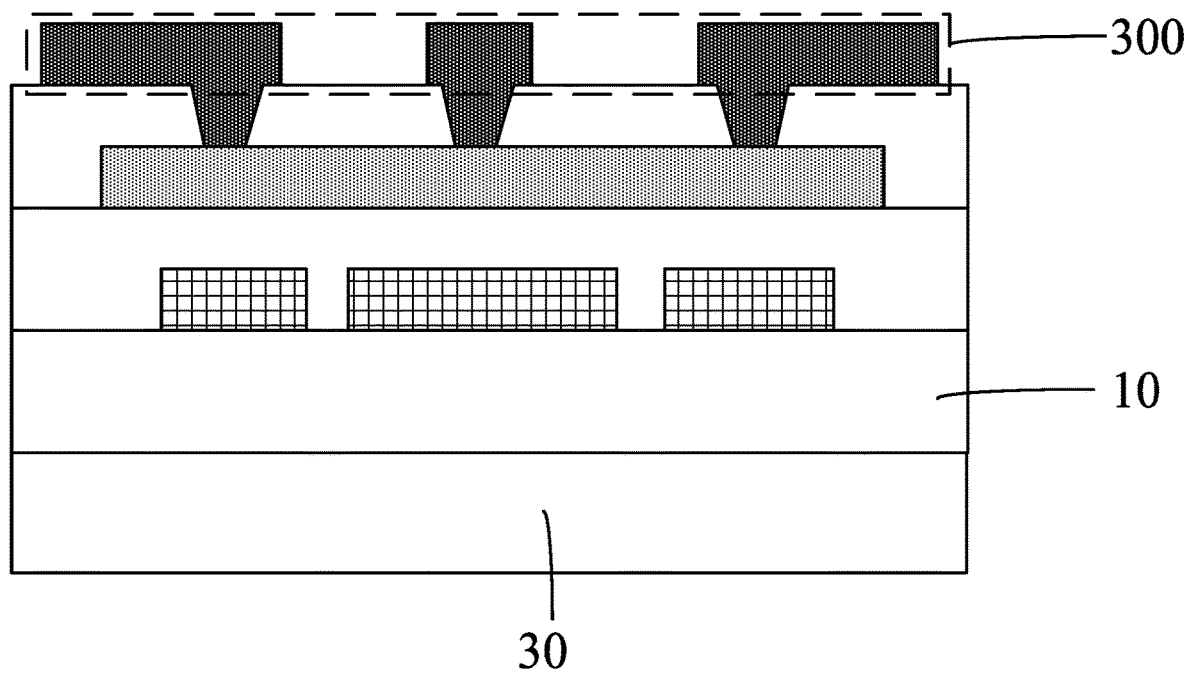
FIG. 10B is a schematic diagram of a structure of another touch display device provided by an embodiment of the present disclosure.

In specific implementation, in some embodiments of the present disclosure, as shown in FIG. 10B, the touch display device may also include an electroluminescent display panel 30. The electroluminescent display panel 30 may include a packaging layer that is configured to package the electroluminescent diode in the electroluminescent display panel, so that the electroluminescent diode is prevented from being adversely affected by external water and oxygen.

In specific implementation, in some embodiments of the present disclosure, as shown in FIG. 10B, the touch substrate can be located on the light emitting side of the electroluminescent display panel 30, and the signal line layer 300 is located on the side, away from the electroluminescent display panel 30, of the base substrate 10. The base substrate 10 can serve as the packaging layer, so that the electroluminescent display panel 30 can be packaged through the base substrate 10, and thus the electroluminescent diode is prevented from being adversely affected by the external water and oxygen. Furthermore, the thickness of the touch display device can also be reduced.

Figure 11:
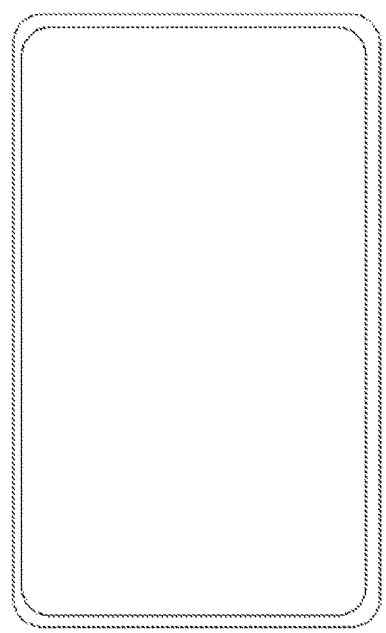
FIG. 11 is a schematic diagram of a structure of another touch display device provided by an embodiment of the present disclosure.

In specific implementation, the touch display device provided by some embodiments of the present disclosure may be a mobile phone with a full screen shown in FIG. 11. Certainly, the touch display device provided by some embodiments of the present disclosure may also be any product or component with a display function, such as a tablet computer, a television, a display, a notebook computer, a digital photo frame and a navigator. Other indispensable components of the touch display device should be understood by those of ordinary skill in the art, and will not be repeated here, nor limit the present disclosure.

According to the touch substrate and the touch display device provided by the embodiments of the present disclosure, the first touch control electrodes are provided with the shadow elimination structures at the first intersections, and the orthographic projections of the shadow elimination structures on the base substrate cover the orthographic projections of the connection through holes on the base substrate, so that shadows of the connection through holes can be shielded by the shadow elimination structures, when the user watches the touch substrate from the side, away from the signal line layer, of the base substrate, and thus the ghosting shadow problem of the connection through holes can be resolved. Furthermore, the first touch control electrodes are set to be grid-shaped, so that the first touch control electrodes can be more uniformly arranged on the base substrate, the shadow elimination structures and the first touch control electrodes are set to be of an integrated structure, then the user can be not prone to perceive the patterns of the shadow elimination structures, and thus the shadow elimination effect can be achieved.

Although preferred embodiments of the present disclosure have been described, additional changes and modifications may be made to these embodiments by those skilled in the art once the basic inventive concept has been learned. Therefore, the appended claims are intended to be interpreted as including the preferred embodiments and all changes and modifications falling within the scope of the present disclosure.

Obviously, those skilled in the art can make various modifications and variations to the embodiments of the present disclosure without departing from the spirit and scope of the embodiments of the present disclosure. Therefore, if these modifications and variations of the embodiments of the present disclosure fall within the scope of the claims of the present disclosure and equivalent technologies thereof, the present disclosure is also intended to include these modifications and variations.

What is claimed is:

1. A touch substrate, comprising:
   a base substrate;
   a first touch control electrode layer on a side of the base substrate; wherein the first touch control electrode layer comprises a plurality of grid-shaped first touch control electrodes arranged at intervals, and the first touch control electrodes extend in a first direction;
   a first insulating layer on a side, facing away from the base substrate, of the first touch control electrode layer;
   a second touch control electrode layer on a side, facing away from the base substrate, of the first insulating layer; wherein the second touch control electrode layer comprises a plurality of grid-shaped second touch control electrodes arranged at intervals, and the second touch control electrodes extend in a second direction;
   a second insulating layer on a side, facing away from the base substrate, of the second touch control electrode layer; wherein the second insulating layer is provided with a plurality of connection through holes; and
   a signal line layer on a side, facing away from the base substrate, of the second insulating layer; wherein the signal line layer comprises a plurality of second signal transmission lines;
   wherein:
   each of the plurality of second touch control electrodes is electrically connected to at least one of the plurality of second signal transmission lines through at least one of the plurality of connection through holes;
   orthographic projections of the first touch control electrodes on the base substrate and orthographic projections of the second touch control electrodes on the base substrate have a plurality of first intersections, wherein the connection through holes each is arranged corresponding to positions of the respective first intersections, and orthographic projections of the connection through holes on the base substrate and orthographic projections of the first intersections on the base substrate have overlapping regions; and
   the first touch control electrodes at the first intersections have shadow elimination structures; and orthographic projections of the shadow elimination structures on the base substrate cover the orthographic projections of the connection through holes on the base substrate.

2. The touch substrate according to claim 1, wherein each of the shadow elimination structures comprises:
   first planar structures;
   wherein the first planar structures and the first touch control electrodes are arranged on a same layer;
   wire widths of the first touch control electrodes in regions, where the first planar structures are located, are larger than those of the first touch control electrodes in other regions; and
   orthographic projection of the first planar structures on the base substrate cover the orthographic projections of the connection through holes on the base substrate.

3. The touch substrate according to claim 2, wherein each shadow elimination structure further comprises:
   strip-shaped first conductive parts;
   wherein the first conductive parts and the first planar structures are arranged on the same layer;
   and an orthographic projection of a first conductive part on the base substrate and an orthographic projection of a first planar structure on the base substrate intersect.

4. The touch substrate according to claim 3, wherein the orthographic projections of the second touch control electrodes on the base substrate cover orthographic projections of the first conductive parts on the base substrate.

5. The touch substrate according to claim 4, wherein in a same first touch control electrode, an orthographic projection of a first conductive part on the base substrate is spaced from orthographic projections of other grids, except a grid of the first touch control electrode in contact with the first conductive part, on the base substrate.

6. The touch substrate according to claim 1, wherein the orthographic projections of the first touch control electrodes on the base substrate and the orthographic projections of the second touch control electrodes on the base substrate have a plurality of second intersections, and orthographic projections of the second intersections on the base substrate are not overlapped with the orthographic projections of the connection through holes on the base substrate; and the touch substrate further comprises a plurality of second planar structures arranged on a same layer with the first touch control electrodes, and orthographic projections of the second intersections on the base substrate and orthographic projections of the second planar structures on the base substrate have overlapping regions.

7. The touch substrate according to claim 6, wherein orthographic projections of the first planar structures on the base substrate and the orthographic projections of the second planar structures on the base substrate are substantially same in shape and size.

8. The touch substrate according to claim 7, wherein the touch substrate further comprises:

a plurality of strip-shaped second conductive parts arranged on the same layer with the first touch control electrodes;

wherein the orthographic projections of the second intersections on the base substrate are partially overlapped with the orthographic projections of the second planar structures on the base substrate.

9. The touch substrate according to claim 8, wherein the orthographic projections of the second touch control electrodes on the base substrate cover orthographic projections of the second conductive parts on the base substrate.

10. The touch substrate according to claim 9, wherein the orthographic projections of the second conductive parts on the base substrate are not overlapped with orthographic projections of the first conductive parts on the base substrate.

11. The touch substrate according to claim 9, wherein in a same first touch control electrode, the first conductive parts are directly electrically connected to the second conductive parts; and in the same touch control electrode, orthographic projections of all the first conductive parts and the second conductive parts on the base substrate are in the orthographic projections of the second touch control electrodes on the base substrate.

12. A touch display device, comprising the touch substrate according to claim 1.

13. The touch display device according to claim 12, further comprising:

a display panel;

wherein the touch substrate is on a light emitting side of the display panel, and the base substrate is on a side, facing away from the display panel, of the signal line layer.

14. The touch display device according to claim 13, wherein the display panel comprises:

at least one of a liquid crystal display panel or an electroluminescent display panel.

15. The touch display device according to claim 12, further comprising:

an electroluminescent display panel that comprises a packaging layer;

wherein the touch substrate is on a light emitting side of the electroluminescent display panel, the base substrate is the packaging layer, and the signal line layer is on a side, facing away from the electroluminescent display panel, of the base substrate.

16. The touch substrate according to claim 1, further comprising:

a plurality of first signal transmission lines;

wherein each of the first touch control electrodes is electrically connected to at least one of the plurality of first signal transmission lines.

17. The touch substrate according to claim 16, further comprising:

a binding area comprising a plurality of first binding terminals and a plurality of second binding terminals;

wherein the first binding terminals and the second binding terminals are bound to a driving integrated circuit;

the first signal transmission lines each is electrically connected to the respective first binding terminals; and the second signal transmission lines each is electrically connected to the respective second binding terminals.

18. The touch substrate according to claim 1, wherein the first direction and the second direction intersect.

19. The touch substrate according to claim 18, wherein the first touch control electrodes are arranged in the second direction, and the second touch control electrodes are arranged in the first direction.

20. The touch substrate according to claim 1, wherein orthographic projections of grid points of grid-shaped patterns of the first touch control electrodes on the base substrate are not overlapped with orthographic projections of grid points of the grid-shaped patterns of the second touch control electrodes on the base substrate.

* * * * *